United States Patent
Cariello et al.

(10) Patent No.: US 11,042,438 B2
(45) Date of Patent: *Jun. 22, 2021

(54) COPY-BACK OPERATIONS IN A MEMORY DEVICE

(71) Applicant: Micron Technology, Inc., Boise, ID (US)

(72) Inventors: Giuseppe Cariello, Boise, ID (US); Fulvio Rori, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/876,788

(22) Filed: May 18, 2020

(65) Prior Publication Data

US 2020/0278907 A1 Sep. 3, 2020

Related U.S. Application Data

(63) Continuation of application No. 16/150,501, filed on Oct. 3, 2018, now Pat. No. 10,656,995.

(51) Int. Cl.
*G11C 16/04* (2006.01)
*G06F 11/10* (2006.01)
(Continued)

(52) U.S. Cl.
CPC ...... *G06F 11/1068* (2013.01); *G06F 12/0246* (2013.01); *G11C 16/10* (2013.01); *G11C 29/42* (2013.01); *G11C 29/52* (2013.01)

(58) Field of Classification Search
CPC . G06F 11/1068; G06F 12/0246; G11C 16/10; G11C 29/42
(Continued)

(56) References Cited

U.S. PATENT DOCUMENTS

| 7,082,048 B2 | 7/2006 | Choi |
| 9,875,035 B2 | 1/2018 | Shin |

(Continued)

FOREIGN PATENT DOCUMENTS

| CN | 106170773 A | 11/2016 |
| CN | 107943712 A | 4/2018 |

(Continued)

OTHER PUBLICATIONS

"Chinese Application Serial No. 201910950268.4, Office Action dated Nov. 12, 2020", w/English translation, 15 pgs.

*Primary Examiner* — Vu A Le
(74) *Attorney, Agent, or Firm* — Schwegman Lundberg & Woessner, P.A.

(57) ABSTRACT

Devices and techniques for performing copy-back operations in a memory device are disclosed herein. A trigger to perform a copy-back operation in relation to a section of data stored on the memory device can be detected. Circuitry of the memory device can then read the section of data at two voltage levels within a read window to obtain a first set of bits and a second set of bits respectively. The first and second sets of bits—which should be the same under normal circumstances—are compared to determine whether a difference between the sets of bits is beyond a threshold. If the difference is beyond a threshold, error correction is invoked prior to completion of the copy-back operation.

21 Claims, 9 Drawing Sheets

(51) Int. Cl.
  *G11C 16/10*   (2006.01)
  *G06F 12/02*   (2006.01)
  *G11C 29/52*   (2006.01)
  *G11C 29/42*   (2006.01)

(58) Field of Classification Search
  USPC .................................................. 365/185.09
  See application file for complete search history.

(56) References Cited

U.S. PATENT DOCUMENTS

| | | |
|---|---|---|
| 10,656,995 B2 | 5/2020 | Cariello et al. |
| 2007/0002615 A1 | 1/2007 | Lee et al. |
| 2013/0073924 A1* | 3/2013 | D'Abreu ............. G06F 11/1068 |
| | | 714/763 |
| 2014/0063940 A1 | 3/2014 | Chen et al. |
| 2014/0355345 A1* | 12/2014 | Avila .................. G06F 11/1048 |
| | | 365/185.09 |
| 2017/0220499 A1 | 8/2017 | Gray |
| 2020/0110660 A1 | 4/2020 | Cariello et al. |

FOREIGN PATENT DOCUMENTS

| | | | |
|---|---|---|---|
| CN | 110413440 A | 11/2019 | |
| CN | 110993006 A | 4/2020 | |

* cited by examiner

COPY-BACK OPERATIONS IN A MEMORY DEVICE

PRIORITY APPLICATION

This application is a continuation of U.S. application Ser. No. 16/150,501, filed Oct. 3, 2018, which is incorporated herein by reference in its entirety.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magneto resistive random-access memory (MRAM), or storage class (e.g., memristor) memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values).

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell that can store more than one bit of data per cell (i.e., that can represent more than two programmed states).

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
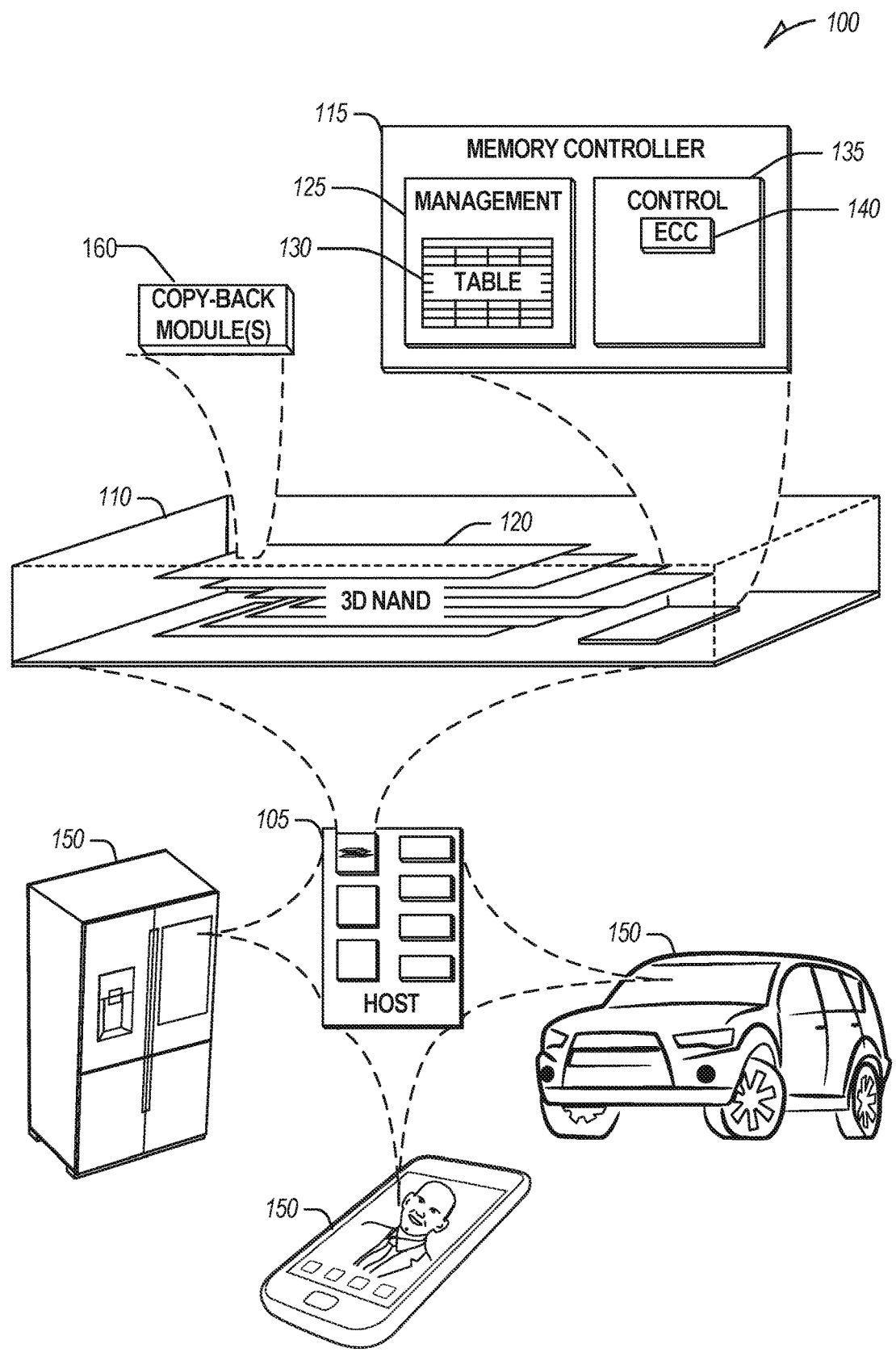
FIG. 1 illustrates an example of an environment including a memory device upon which one or more embodiments can be implemented.

Data stored to NAND devices can become corrupt during power loss or other events. A memory controller (e.g., controller included in a managed NAND device, host, etc.) can perform power loss management (e.g., when power is restored) in response to these events to detect and possibly correct such corrupt data. For example, the host can perform a one-shot refresh operation in which data is read from a source address, checked for errors, and then written back to the same source or a destination address. Generally, the error checking is performed by the host or the memory controller, and is not addressed on a NAND die, for example. Thus, in these cases, the off-die error detection and correction introduce latencies, are inefficient, and negatively impact the user experience.

Some NAND devices (e.g., NAND integrated circuits (ICs), memory devices, etc.) can perform internal copy-back operations that read data from one address or block of addresses and write the data back to a destination address or block of addresses without interacting with a memory controller (whether within a managed NAND package or a host). However, in such conventional NAND internal copy-back operations, data integrity and errors are not checked, making them unsuitable for use in power loss management. What is needed is a corruption detection technique that does not rely on a memory controller for all operations but can involve the memory controller when corruption is suspected.

This document addresses various techniques for minimizing memory controller intervention during performance of copy-back operations in or associated with one or more memory devices. Specifically, the described copy-back operations (which in some examples can be performed at least in part by a copy-back module, in or associated with the memory device, as described later herein) are performed with minimal or no intervention from a memory controller by internally (e.g., within the NAND die) checking whether data stored in a given memory section that is subject to the copy-back operation is corrupt. In some examples, corruption can be detected in reference to the charge distributions for stored data. Generally, in NAND devices data is written to a charge storage structure (such as a floating gate or a charge trap element) such that the storage structure has a charge within one of several distributions representing bits (e.g., for SLC two of the distributions respectively represent a '0' or a '1'). The distributions are spread from each other such that a read voltage applied will overcome the floating gate interference for one distribution and not the other. When, due to corruption, the charge distributions shift into this read window—a range of voltages that, if used for a read, overcome one charge distribution but not another, enabling detection as to whether the element being read is one symbol (e.g., a zero represented by a first charge distribution) or another symbol (e.g., a one represented by a second charge distribution—it is possible that a bit written as a '1' is on the wrong side of the read voltage-usually towards the middle of the read window—and is interpreted as a '0'. Detecting this condition suggests that the portion of the memory device will benefit from error correction.

To detect the shifted charge distributions for a portion of the memory device, a copy-back module checks data as it is read at two different voltages within the read window and compares the results. Because the voltages are within the read window, the results of the two reads should be the same when the charge distributions coincide with design parameters. However, if something has occurred to shift the charge distributions, the two reads can differ if one of the charge distributions moves into the read window. This condition suggests an issue—such as a cross temperature write, read disturb, or other circumstance—that can benefit from error correction. Accordingly, the copy-back module can provoke error correction (e.g., by signaling the host or a memory controller) when the results of the two reads differ, for example, by a threshold.

The following illustrates a use case in which the copy-back module provides better operation than previous techniques. Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., Internet-of-Things (IoT) devices, etc.), often operate in extreme temperature or power conditions that can lead to data integrity issues. For example, devices operation on battery power can experience power-out or low-voltage power situations as the batteries drain over time. In such cases, the electronic devices can become unstable. After power is restored subsequent to a given power loss event, a memory device, or memory controller, can perform a number of operations to ensure stability of the data. One such operation includes performing a refresh—e.g., copying valid data from a first set of blocks to a second set of blocks—for the last block (or set of blocks) stored prior to the power loss event. For some areas, such as device meta-data, the refresh can occur at each initialization to ensure that the operating parameters of the NAND device are free from corruption. As initialization can occur frequently in a battery operated device, and as the integrity of this data entails postponing read or write requests until the refresh is complete, users can experience high latencies during these periods. The copy-back module can relieve these latencies by performing the refresh using an on-die copy-back when there are no errors evident. Further, by invoking the error correction facility of the memory controller when an error is detected, the resultant data integrity is no slower or less accurate than memory controller based refreshes. Additional details and examples are described below.

FIG. 1 illustrates an example of an environment 100 including a host device 105 and a managed memory device 110 configured to communicate with each other over a communication interface. Thus, as described herein, actions ascribed to the host device 105 are external to those of the managed memory device 110, even when, as illustrated, the managed memory device 110 is a package within the host device 105. Thus, in some examples, the managed memory device 110 can be included as part of the host 105 (as depicted in FIG. 1) or the managed memory device 110 can be a separate component external to the host device 105. The host device 105 or the managed memory device 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150.

Figure 5:
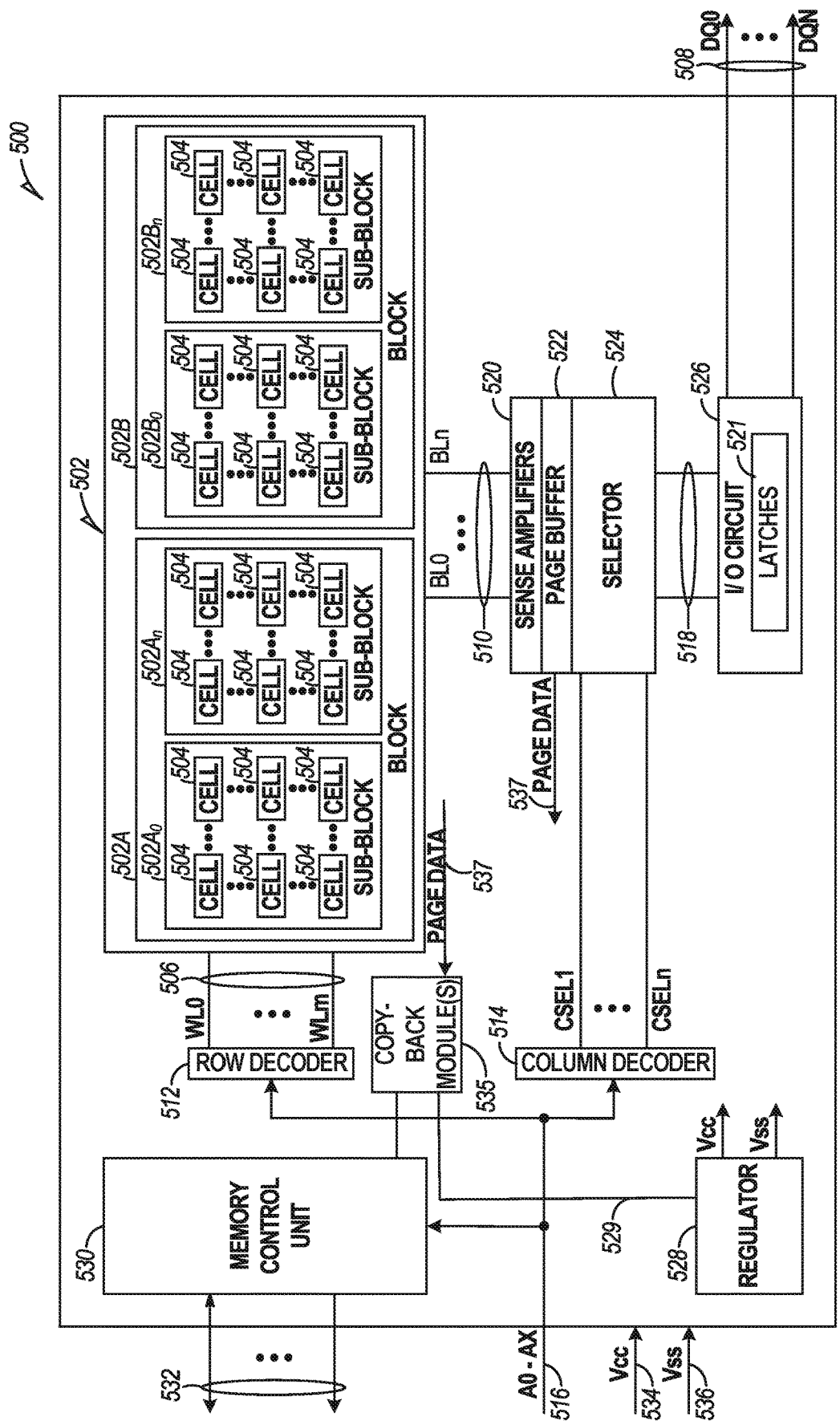
FIG. 5 illustrates an example block diagram of a memory module upon which one or more embodiments can be implemented.

The managed memory device 110 includes a memory controller 115 and a memory array 120 including, for example, a number of individual memory devices (e.g., each memory device being a stack of three-dimensional (3D) NAND die). Thus, the managed memory device 110 includes the memory controller 115 and one or more memory devices—an example of a memory device is illustrated in FIG. 5. In examples without the managed memory device 110, the memory controller 115, or its equivalent, will be part of the host device 105 and external to the package of the memory device or devices that comprise the memory array 120. In 3D architecture semiconductor memory technology, vertical structures are stacked, increasing the number of tiers, physical pages, and accordingly, the density of a given memory device (e.g., a storage device).

In an example, the managed memory device 110 can be a discrete memory or storage device component of the host device 105. In other examples, the managed memory device 110 can be a portion of an integrated circuit (e.g., system on a chip (SOC), etc.), stacked or otherwise included with one or more other components of the host device 105.

One or more communication interfaces can be used to transfer data between the managed memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, control circuitry, or a memory card reader. In some examples, the host device 105 can be a machine having some portion, or all, of the components discussed in reference to the machine 900 of FIG. 9. Data can be transferred between the managed memory device 110 and other components over an I/O bus.

The memory controller 115 can receive instructions from processing circuitry (e.g., a processor) of the host device 105, and can communicate with the memory array 120, such as to transfer data to (e.g., write or erase) or from (e.g., read) one or more of the memory devices and associated memory cells, planes, sub-blocks, blocks, or pages of the memory array 120. The memory controller 115 can include, among other things, circuitry or firmware, including one or more components or integrated circuits. For example, the memory controller 115 can include one or more circuits, control circuitry, or components configured to control access across the memory array 120 and to provide a translation layer between the host device 105 and the memory devices of the memory array 120. The memory controller 115 can include one or more input/output (I/O) circuits, lines, or interfaces to transfer data to or from the memory array 120. The memory controller 115 can include a memory manager 125 and an array controller 135.

The array controller 135 can include, among other things, circuitry or components configured to control memory operations associated with writing data to, reading data from, or erasing one or more memory cells of the memory devices in the memory array 120. The memory operations can be based on, for example, host commands received from processing circuitry of the host device 105, or internally generated by the memory manager 125 (e.g., in association with wear leveling, error detection or correction, etc.).

In operation, data is typically written to or read from the NAND managed memory device 110 in pages and erased in blocks. However, one or more memory operations (e.g., read, write, erase, etc.) can be performed on larger or smaller groups of memory cells, as desired. The data transfer size of a NAND managed memory device 110 is typically referred to as a page, whereas the data transfer size of a host is typically referred to as a sector.

The array controller 135 can include an error correction code (ECC) component 140, which can include, among other things, an ECC engine or other circuitry configured to detect or correct errors associated with writing data to or reading data from one or more memory cells of the memory devices coupled to the memory controller 115. ECC component 140, for example, can detect or compute a bit-error-rate (BER) associated with performing a number of memory operations. The BER can correspond to bit errors occurring in latches of an I/O bus, internal errors of controller 115, errors occurring in one or more of the memory devices of the managed memory device 110. The memory controller 115 can be configured to actively detect and recover from error occurrences (e.g., bit errors, operation errors, etc.) associated with various operations or storage of data, while maintaining integrity of the data transferred between a processor of the host device 105 and the managed memory device 110, or maintaining integrity of stored data (e.g., using redundant RAID storage, etc.), and can remove (e.g., retire) failing memory resources (e.g., memory cells, memory arrays, pages, blocks, etc.) to prevent future errors. In an example, some of these operations, such as detecting a read fault, can be implemented in a memory control unit of each memory device in the memory array 120.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection (e.g., bit-error-rate (BER) monitoring) or correction, block retirement, or one or more other memory management functions. The memory manager 125 can parse or format host commands (e.g., commands received from processing circuitry of host device 105) into device commands (e.g., commands associated with operation of a memory array, etc.), or generate device commands (e.g., to accomplish various memory management functions) for the array controller 135 or one or more other components of the managed memory device 110. In an example, some of these operations can be implemented in a memory control unit of each memory device in the memory array 120.

The memory manager 125 can include a set of management tables 130 configured to maintain various information associated with one or more component of the managed memory device 110 (e.g., various information associated with a memory array or one or more memory cells coupled to the memory controller 115). For example, the management tables 130 can include information regarding block age, block erase count, error history, error parameter information, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts (e.g., an error parameter) is above a threshold (e.g., an allowable error threshold), the bit error can be referred to as an uncorrectable bit error. The management tables 130 can maintain a count of correctable or uncorrectable bit errors, among other things.

As noted above, the memory array 120 can include one or more memory devices. The individual memory devices can include several memory cells arranged in, for example, a number of devices, planes, sub-blocks, blocks, or pages. As one example, a 48 GB TLC NAND memory device can include 18,592 bytes of data per page (16,384+2208 bytes), 1536 pages per block, 548 blocks per plane, and four or more planes per device. As another example, a 32 GB MLC memory device (storing two bits of data per cell (i.e., four programmable states)) can include 18.592 bytes of data per page (16,384+2208 bytes), 1024 pages per block, 548 blocks per plane, and four planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

Different types of memory devices can provide for different page sizes, or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash memory device can have a higher bit error rate than a corresponding single-level cell (SLC) NAND flash memory device. As such, the MLC device can require more metadata bytes for error data than the corresponding SLC device.

As noted above, individual memory devices of the memory array 120 can include processing circuitry to perform various operations. An example of a memory device is illustrated in FIG. 5 and described below. Generally, the processing circuitry on a memory device enables some operations, such as address decoding, cell writing (e.g., managing voltages, fault detection, etc.), among other operations. Generally missing from the memory devices are processing intensive operations, such as error correction paths (e.g., read-retry, ECC, etc.). Generally included in such memory devices are a point-to-point copy from one portion of the memory device to another portion of the same memory device. It is this operation that is here called "copy-back."

When the memory array is initialized, the host device 105 or the memory controller 115 can perform a refresh (e.g., a one-shot-refresh) in a number of circumstances, such as part of power loss management. The purpose of the refresh is to rectify possibly damaged data in the memory devices due to the power loss. One way to implement the refresh includes reading the data from the memory device, performing error correction by the memory controller 115 or the host device 105, and then writing the data back to the memory device. This sequence, while resulting in good data, can be prohibitive in terms of latency. Another approach is to use the copy-back capabilities of the memory device itself. While this is very fast, the memory device generally does not detect data errors already stored in its cells, and the operation can result in simply propagating bad data.

To address these issues, the memory device can include a copy-back module 160. The copy-back module includes circuitry to detect errors in the stored data via detection of a charge distribution shift. The description below with relation to FIG. 4 describes how power loss can lead to several charge storing issues in the distributions. To error detection via charge distribution shifting, the copy-back module 160 reads a section of data at two different voltages that are within a read window. Because the two different voltages are within the read window, the result of the two reads should be the same. The copy-back module 160 compares the bits of the two reads of the section of data to detect errors in the data by noting how the two reads differ. If there is no difference, then there is no error. However, if the two reads have different results, then it is probable that one or both charge distributions of cells in the section of data have moved from their design parameters.

If an error is not detected, the copy-back module 160 completes the copy-back operation without interruption (e.g., without contacting the memory controller 115 or the host device 105). This operational path leads to low-latency, memory device native, copy-back efficiency.

However, if an error is detected, then the copy-back module 160 invokes error correction on the section of data. Here, error correction can include a variety of techniques, such as read-retry, trim level adjustments, ECC recovery, or other RAID operations, to recover the damaged data. Generally, invoking the error correction involves the memory device (e.g., via the copy-back module 160) signaling the memory controller 115 or the host device 105 to perform the error correction. Example signals can include setting a status register that is polled by the memory controller 115 or the host device 105, using an interrupt, including status as a return to another operation, etc.

The copy-back operation is interrupted until the error correction is performed. In an example, the interruption is specific with respect to the section of data, whereby the copy-back module 160 continues processing other sections of data via the two-read error detection technique while waiting the result of the error correction. When the error correction is complete, the copy-back module 160 can continue performing the copy-back operation until it completes. An example the of copy-back module 160 is described below in connection with FIG. 6.

Figure 2A:
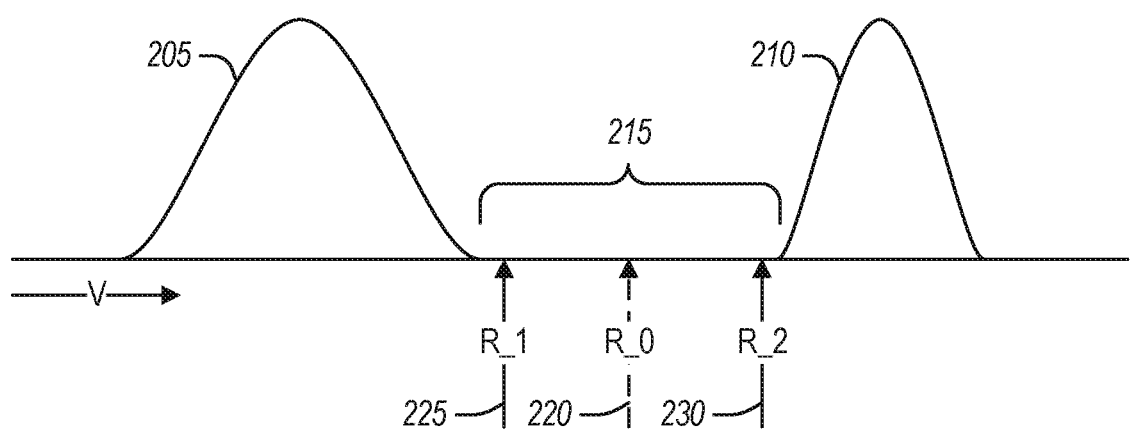
FIGS. 2A-2B illustrate relative positions of charge distributions and read voltages within a read window.
Figure 2B:
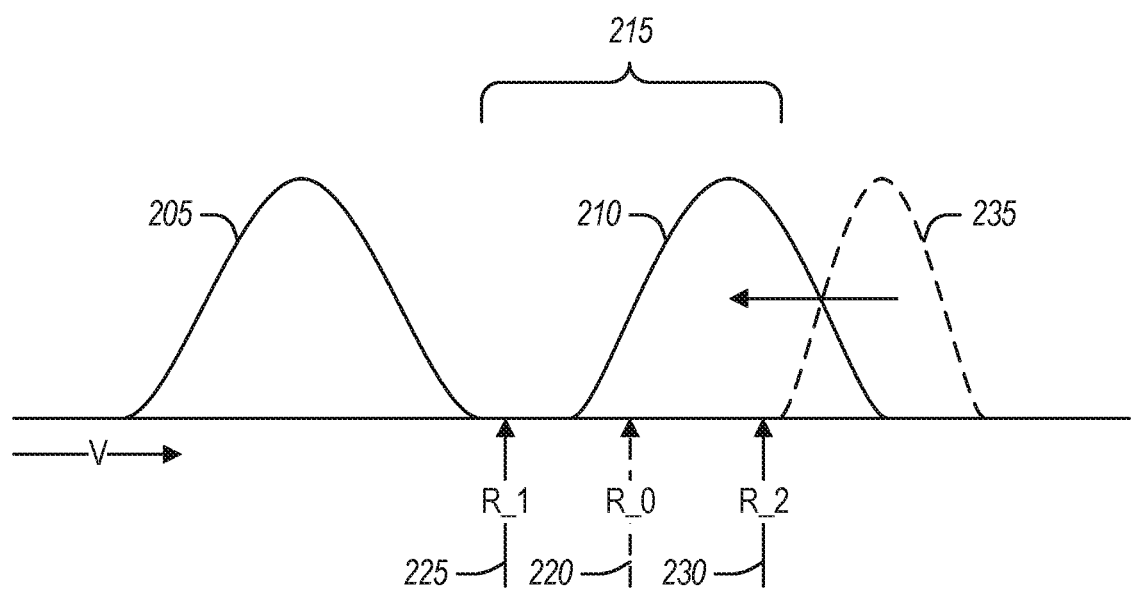

FIGS. 2A-2B illustrate relative positions of charge distributions and read voltages within a read window. Additional details regarding device organization that leads to the charge distributions of cells in a page (e.g., reading unit), as well as the standard read voltage applied to discern the logical values (e.g., '1' or '0', or other symbols in MLC encodings) are given below with reference to FIGS. 3 and 4.

FIG. 2A illustrates SLC distributions 205 and 210 in their proper positions as defined by design parameters of the device. Given these distributions, there is a read window 215 within which a standard read voltage 220 applied will differentiate between the distribution 205 and the distribution 210. As illustrated here, the first read voltage 225 and the second read voltage 230 are both within the read window and will produce the same output as the standard read voltage 220. Thus, in the example illustrated in FIG. 2A, there will be no difference in the first set of bits that result from a read at the first read voltage 225, or a second set of bits that result from another read at the second read voltage 230.

FIG. 2B illustrates a variation on the example of FIG. 2A, where the distribution 210 has deviated from its designed parameter position 235. This shift can have resulted from numerous sources, such as cross-temperature writes, power anomalies during writes, etc. As illustrated, the distribution 210 has shifted into the read window 215. In this circumstance, reads at the standard read voltage 220 become ambiguous because it does not distinguish between distributions 205 and 210, but rather is within distribution 210. To resolve the ambiguity, the two read voltages 225 and 230 can be used. As illustrated here, it is likely that the first set of bits resulting from a read at read voltage 225 will be different than the second set of bits resulting from a read at read voltage 230. Thus, via these two reads, a copy-back module can readily determine that there is a problem with the distributions. When there is no problem with the distributions 205 and 210, the copy-back module can continue the copy-back without involve off-die resources, resulting in lowered latencies. If, however, a distribution problem is detected, then the die can use traditional error correction mechanisms, perhaps at increased latencies, to provide host (e.g., memory controller) reliability to the data.

Figure 3:
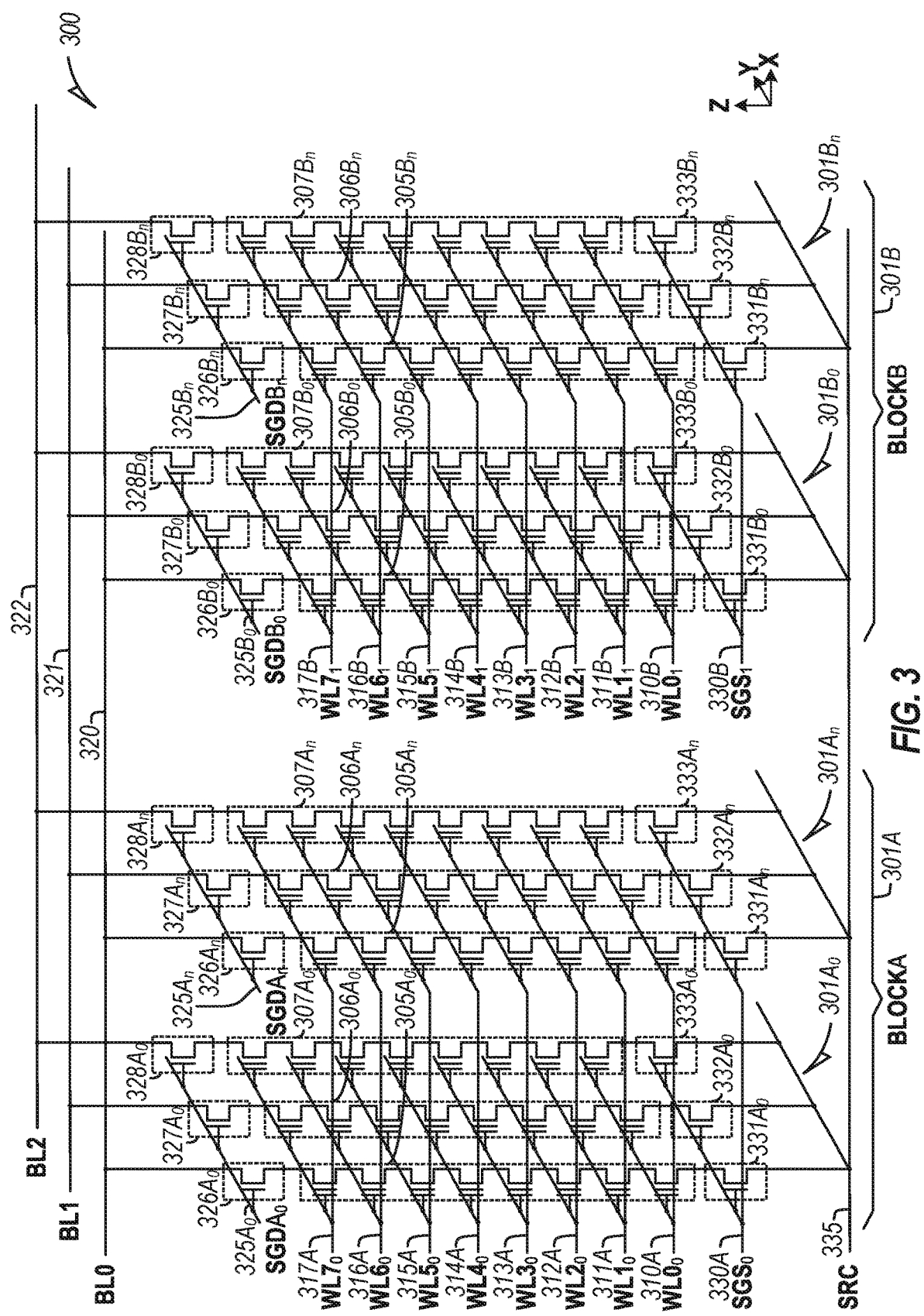
FIGS. 3-4 illustrate schematic diagrams of an example of a 3D NAND architecture semiconductor memory array upon which one or more embodiments can be implemented.

FIG. 3 illustrates an example schematic diagram of a 3D NAND architecture semiconductor memory array 300 including a number of strings of memory cells (e.g., first-third $A_0$ memory strings $305A_0$-$307A_0$, first-third $A_n$ memory strings $305A_n$-$307A_n$, first-third $B_0$ memory strings $305B_0$-$307B_0$, first-third $B_n$ memory strings $305B_n$-$307B_n$, etc.), organized in blocks (e.g., block A 301A, block B 301B, etc.) and sub-blocks (e.g., sub-block $A_0$ $301A_0$, sub-block $A_n$ $301A_n$, sub-block $B_0$ $301B_0$, sub-block $B_n$ $301B_n$, etc.). The memory array 300 represents a portion of a greater number of similar structures than would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 335 or a source-side select gate (SGS) (e.g., first-third $A_0$ SGS $331A_0$-$333A_0$, first-third $A_n$ SGS $331A_n$-$333A_n$, first-third $B_0$ SGS $331B_0$-$333B_0$, first-third $B_n$ SGS $331B_n$-$333B_n$, etc.) and a drain-side select gate (SGD) (e.g., first-third $A_0$ SGD $326A_0$-$328A_0$, first-third $A_n$ SGD $326A_n$-$328A_n$, first-third $B_0$ SGD $326B_0$-$328B_0$, first-third $B_n$ SGD $326B_n$-$328B_n$, etc.). Each string of memory cells in the 3D memory array can be arranged along the X direction as data lines (e.g., bit lines (BL) BL0-BL2 320-322), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). The illustrated memory device provided for purposes of description includes two blocks, each block having two sub-blocks, each sub-block having a single physical page, with each physical page having three strings of memory cells, and each string having 8 tiers of memory cells. In actual devices, the memory array 300 will typically include a much greater number of blocks, sub-blocks, physical pages, strings of memory cells, memory cells, and/or tiers. For example, each string of memory cells can include a selected number of tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 300 includes a control gate (CG) coupled to (e.g., electrically or otherwise operatively connected to) an access line (e.g., word lines (WL) $WL0_0$-$WL7_0$ 310A-317A, $WL0_1$-$WL7_1$ 310B-317B, etc.), which collectively couples the control gates (CGs) across a specific tier, or a portion of a tier, as desired. Specific tiers in the 3D memory array 300, and accordingly, specific memory cells in a string, can be accessed or controlled using respective access lines. Groups of select gates can be accessed using various select lines. For example, first-third $A_0$ SGD $326A_0$-$328A_0$ can be accessed using an $A_0$ SGD line $SGDA_0$ $325A_0$, first-third $A_n$ SGD $326A_n$-$328A_n$ can be accessed using an SGD line $SGDA_n$ $325A_n$, first-third $B_0$ SGD $326B_0$-$328B_0$ can be accessed using an $B_0$ SGD line $SGDB_0$ $325B_0$, and first-third $B_n$ SGD $326B_n$-$328B_n$ can be accessed using a $B_n$ SGD line $SGDB_0$ $325B_n$. First-third $A_0$ SGS $331A_0$-$333A_0$ and first-third $A_n$ SGS $331A_n$-$333A_n$ can be accessed using a gate select line $SGS_0$ 330A, and first-third $B_0$ SGS $331B_0$-$333B_0$ and first-third $B_n$ SGS $331B_n$-$333B_n$ can be accessed using a gate select line $SGS_1$ 330B.

In an example, the memory array 300 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 4:
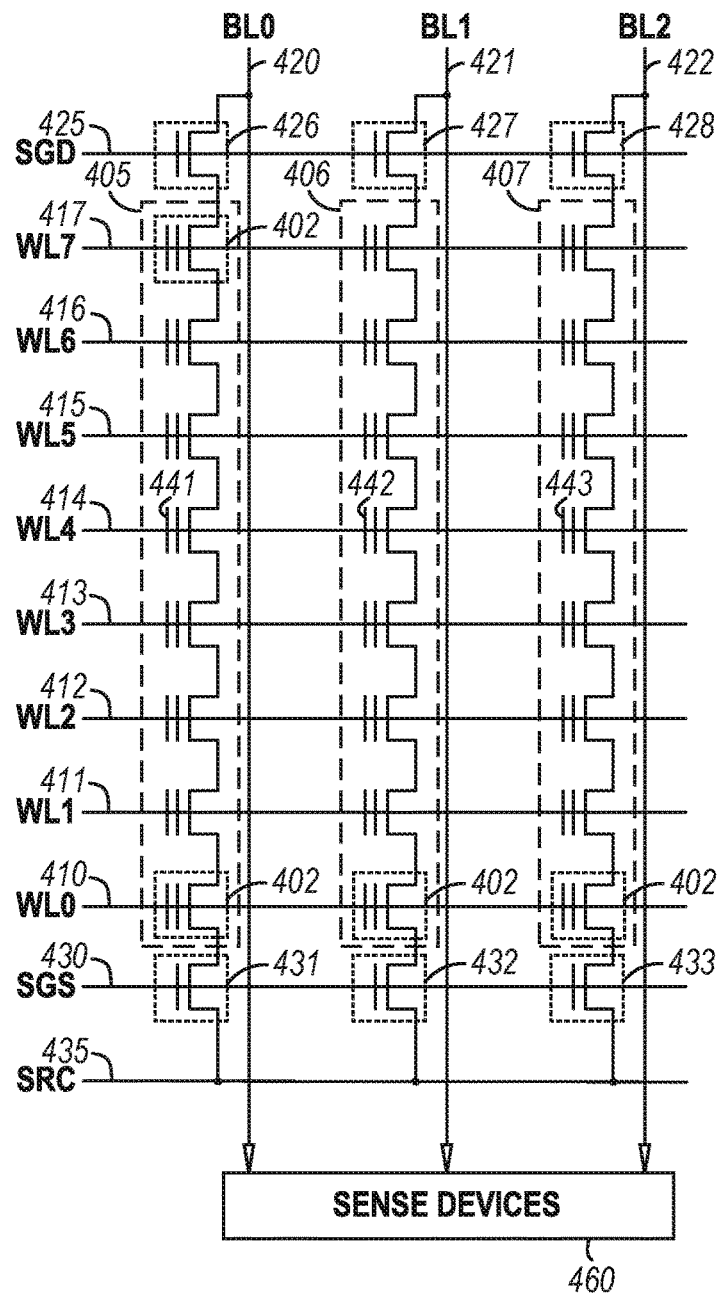

FIG. 4 illustrates an example schematic diagram of a portion of a NAND architecture semiconductor memory array 400 including a plurality of memory cells 402 arranged in a two-dimensional array of strings (e.g., first-third strings 405-407) and tiers (e.g., illustrated as respective word lines (WL) WL0-WL7 410-417, a drain-side select gate (SGD) line 425, a source-side select gate (SGS) line 430, etc.), and devices or sense amplifiers 460. For example, the memory array 400 can illustrate an example schematic diagram of a portion of one physical page of memory cells of a 3D NAND architecture semiconductor memory device, such as illustrated in FIG. 3.

Each string of memory cells is coupled to a source line (SRC) using a respective source-side select gate (SGS) (e.g., first-third SGS 431-433), and to a respective data line (e.g., first-third bit lines (BL) BL0-BL2 420-422) using a respective drain-side select gate (SGD) (e.g., first-third SGD 426-428). Although illustrated with 8 tiers (e.g., using word lines (WL) WL0-WL7 410-417) and three data lines (BL0-BL2 426-428) in the example of FIG. 4, other examples can include strings of memory cells having more or fewer tiers or data lines, as desired.

In a NAND architecture semiconductor memory array, such as the example memory array 400, the state of a selected memory cell 402 can be accessed by sensing a current or voltage variation associated with a particular data line containing the selected memory cell. The memory array 400 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 441-443) of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 460, coupled to one or more of the data lines (e.g., first, second, or third bit lines (BL0-BL2) 420-422), can detect the state of each memory cell 402 in respective data lines by sensing a voltage or current on a particular data line. Sense amplifiers 460 can determine whether a state of a given memory cell 402 or set of cells is unstable. In such circumstances, sense amplifiers 460 can record this instability as an error parameter. Sense amplifiers 460 can communicate with a controller to correct the error parameter.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

To read data from a given page of memory cells, a read threshold voltage or potential (Vt) is applied to the word lines and the voltage is sensed from the corresponding data lines. If a given cell is programmed, application of the Vt (or voltage within a range of Vt), can result in a given voltage level (within a programmed range) being sensed at the corresponding bit line. If the voltage level that is sensed is within the acceptable programmed range, a bit value of '0' can be determined to be stored in the given cell. If the given cell is not programmed, application of the Vt (or voltage within a range of Vt), can result in a given voltage level (within an erased range) being sensed at the corresponding bit line. If the voltage level that is sensed is within the acceptable erased range, a bit value of '1' can be determined to be stored in the given cell.

In some circumstances, such as during a power loss event, certain memory cells cannot reach their intended programmed state. As a result, data stored in the given memory cells can become corrupt. Particularly, if the memory cell did not reach its intended programmed state before the power loss event, subsequent read operations of that cell can be unreliable. For example, application of a first voltage within a range of Vt, can result in a given voltage level that is closer to a programmed range being sensed at the corresponding bit line and accordingly a bit value of '0' can be determined. In addition, application of a second, different voltage still within the range of Vt can result in a given voltage level that is closer to an erased range being sensed at the corresponding bit line and accordingly a bit value of '1' can be determined. As such, the data stored in the given memory cell is corrupt and unstable and can need to be corrected. The copy-back module 160 detects such corruption and perform error handling as needed using the memory controller 115.

FIG. 5 illustrates an example block diagram of a memory device 500 including an array 502 having a plurality of memory cells 504, and one or more circuits or components to provide communication with, or perform one or more memory operations on, the array 502. The memory device 500 can include a row decoder 512, a column decoder 514, sense amplifiers 520, a page buffer 522, a selector 524, an input/output (I/O) circuit 526, and a memory control unit 530. The memory device 500 is an example of memory devices that can comprise the memory array 120 of FIG. 1.

The memory cells 504 of the array 502 can be arranged in blocks, such as first and second blocks 502A, 502B. Each block can include sub-blocks. For example, the first block 502A can include first and second sub-blocks $502A_0$, $502A_n$, and the second block 502B can include first and second sub-blocks $502B_0$, $502B_n$. Each sub-block can include a number of physical pages, each page including a number of memory cells 504. Although illustrated herein as having two blocks, each block having two sub-blocks, and each sub-block having a number of memory cells 504, in other examples, the array 502 can include more or fewer blocks, sub-blocks, memory cells, etc. In other examples, the memory cells 504 can be arranged in a number of rows, columns, pages, sub-blocks, blocks, etc., and accessed using, for example, access lines 506, first data lines 510, or one or more select gates, source lines, etc.

The memory control unit 530 can control memory operations of the memory device 500 according to one or more signals or instructions received on control lines 532, including, for example, one or more clock signals or control signals that indicate a desired operation (e.g., write, read, erase, copy-back, etc.), or address signals (A0-AX) received on one or more address lines 516. One or more devices external to the memory device 500 can control the values of the control signals on the control lines 532, or the address signals on the address line 516. Examples of devices external to the memory device 500 can include, but are not limited to, a memory controller (e.g., memory controller 115 of FIG. 1), control circuitry, a processor (e.g., from the host device 105 of FIG. 1), or one or more circuits or components not illustrated in FIG. 5.

The memory device 500 can use access lines 506 and first data lines 510 to transfer data to (e.g., write or erase) or from (e.g., read) one or more of the memory cells 504. The row decoder 512 and the column decoder 514 can receive and decode the address signals (A0-AX) from the address line 516, can determine which of the memory cells 504 are to be accessed, and can provide signals to one or more of the access lines 506 (e.g., one or more of a plurality of word lines (WL0-WLm)) or the first data lines 510 (e.g., one or more of a plurality of bit lines (BL0-BLn)), such as described above.

The memory device 500 can include sense circuitry, such as the sense amplifiers 520, configured to determine the values of data on (e.g., read), or to determine the values of data to be written to, the memory cells 504 using the first data lines 510. For example, in a selected string of memory cells 504, one or more of the sense amplifiers 520 can read a logic level in the selected memory cell 504 in response to a read current flowing in the memory array 502 through the selected string to the data lines 510.

One or more devices external to the memory device 500 can communicate with the memory device 500 using the I/O lines (DQ0-DQN) 508, address lines 516 (A0-AX), or control lines 532. The input/output (I/O) circuit 526 can transfer values of data in or out of the memory device 500, such as in or out of the page buffer 522 or the memory array 502, using the I/O lines 508, according to, for example, the control lines 532 and address lines 516. For example, I/O circuit 526 can include one or more latches 521 for temporarily storing data to be written to memory array 502 and data to be read by the one or more external devices from memory array 502. The page buffer 522 can store data received from the one or more devices external to the memory device 500 before the data is programmed into relevant portions of the memory array 502 or can store data read from the memory array 502 before the data is transmitted to the one or more devices external to the memory device 500.

The column decoder 514 can receive and decode address signals (A0-AX) into one or more column select signals (CSEL1-CSELn). The selector 524 (e.g., a select circuit) can receive the column select signals (CSEL1-CSELn) and select data in the page buffer 522 representing values of data to be read from or to be programmed into memory cells 504. Selected data can be transferred between the page buffer 522 and the I/O circuit 526 using second data lines 518.

The memory control unit 530 can receive positive and negative supply signals, such as a supply voltage (Vcc) 534 and a negative supply (Vss) 536 (e.g., a ground potential), from an external source or supply (e.g., an internal or external battery, an AC-to-DC converter, etc.). In certain examples, the memory device 500 can include a regulator 528 to internally provide positive or negative supply signals to memory control unit 530.

In the example illustrated in FIG. 5, the memory device 500 includes the copy-back module 535 as a separate component (e.g., circuitry) from the memory control unit 530. In an example, the copy-back module 535 is integrated into the memory control unit 530. The copy-back module 535 can be coupled to regulator 528 to change the read voltage (Vt) applied to the memory array 502 for reading data.

For example, copy-back module 535 implements a copy-back operation with minimal or no involvement by an external entity (e.g., memory controller) by internally detecting data corruption in array 502. The copy-back module 535 can instruct regulator 528 via signal 529 to apply a first voltage (within range of Vt representing the read window) to read a page of data from memory array 502 from a first storage location. The copy-back module 535 obtains the page data 537 read at the first voltage from page buffer 522 and temporarily stores this page data 537 in a storage device (e.g., a register or a secondary data cache (SDC)). The copy-back module 535 then instructs the regulator 528 via signal 529 to apply a second voltage (within range of Vt that is less than or greater than the first voltage by a predetermined amount) to read the page of data from memory array 502 from the same first storage location and temporarily store this page data in the storage device (e.g., a register or a primary data cache (PDC)). The copy-back module 535 obtains the page data 537 read at the second voltage from page buffer 522 and temporarily stores this page data in a storage device (e.g., a register).

The copy-back module 535 compares the two read page data sets (e.g., by computing a difference between the two page data sets or performing a logical XOR operation on the data sets). Based on the comparison and using a Cfbyte operation, copy-back module 535 counts the number of bits that differ between the two read pages. In response to detecting that the number of bits that differ between the two data sets exceeds a corruption threshold, the copy-back module 535 invokes error correction. In an example, this invocation of error correction includes transferring the read page data via control lines 532 to an external device (e.g., a memory controller or a processor on host device 105) to recover the read page data (e.g., for performing error correction). In response to detecting that the number of bits that differ between the two data sets does not exceed the corruption threshold, copy-back module 535 stores the read page data in memory array 502 at a destination address.

When error correction is successful on page data, it is provided to the copy-back module 535, which then stores the corrected page to the destination address. If the error correction is not successful, the copy-back module 535 can terminate the copy-back operation (e.g., discontinue reading and writing subsequent pages indicated by the copy-back operation).

The copy-back module 535 determines whether additional or subsequent pages are left to copy-back and performs the same read operation at two read voltages and copy-back on any such additional or subsequent pages. For example, copy-back module 535 can increment the page number and source address. The copy-back module 535 reads the next page number from the incremented source address at two different voltages and compares the number of bits that differ, if any, to detect corruption.

Figure 6:
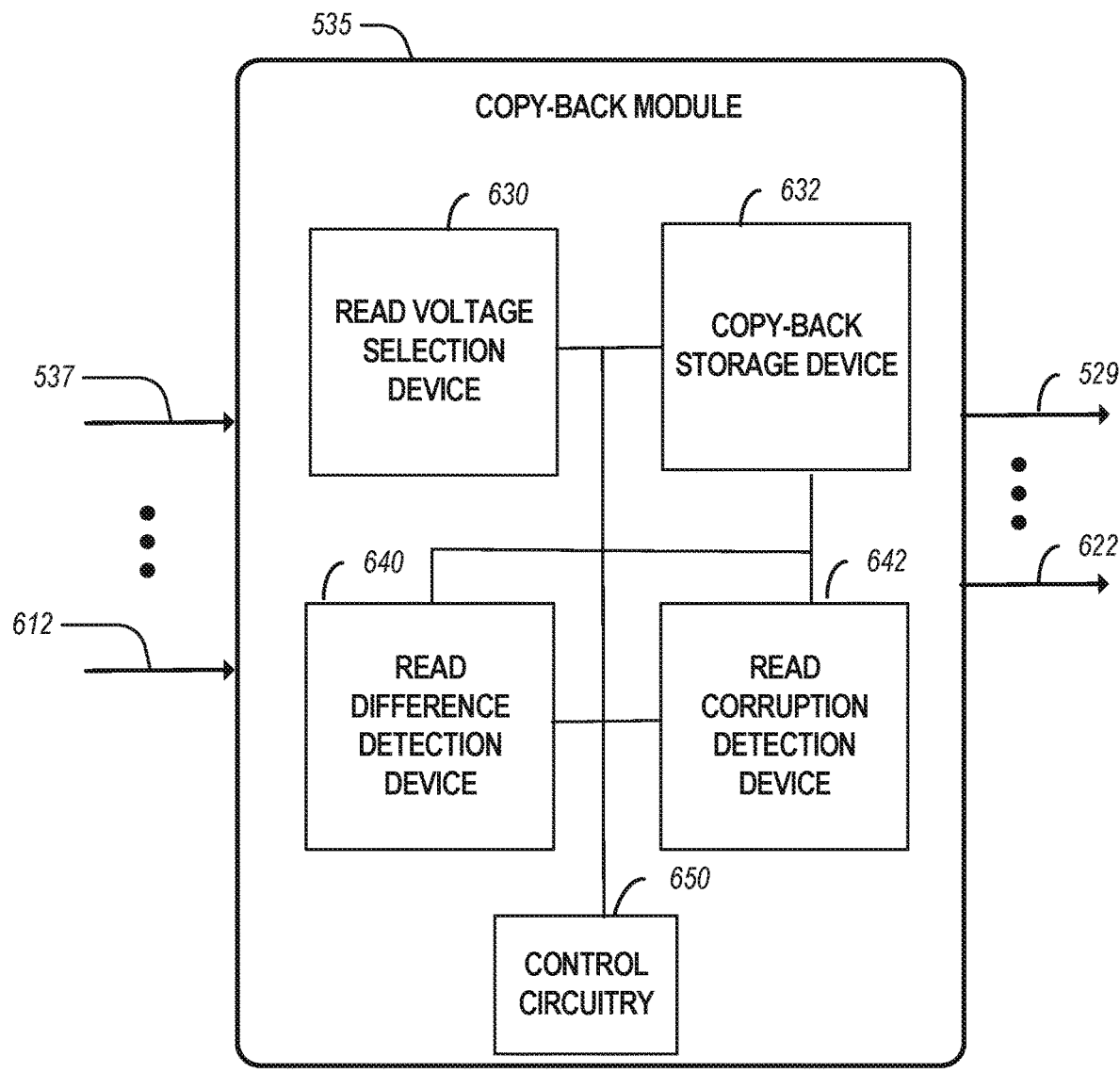
FIG. 6 is a block diagram illustrating an example of a copy-back module upon which one or more embodiments can be implemented.

FIG. 6 is a block diagram illustrating an example of a copy-back module 535 upon which one or more embodiments can be implemented. The copy-back module 535 includes a read voltage selection device 630, a copy-back storage device 632, a read difference detection device 640, a read corruption detection device 642, and control circuitry 650.

The control circuitry 650 determines whether data stored in a given memory address or location is corrupt. For example, the control circuitry 650 performs a process described above and below to read data from a given address at two different voltages, compare the read data to determine whether a number of bits that differ between the read data differs by more than a corruption threshold, and process the data based on the difference. For example, the control circuitry 650 processes the read data based on the difference by invoking error correction (e.g., setting a register, performing an interrupt, transferring the read data, etc.) from an external entity if the read data is corrupt, or by storing the read data to a destination address if no corruption is found.

In some embodiments, the control circuitry 650 of the copy-back module 535 can receive an instruction via signal 612 to perform a copy-back operation. The instruction can specify a source address, a destination address, a starting page and an ending page for which to perform a copy-back operation. The control circuitry 650 stores the starting page as the current page being read. The control circuitry 650 reads the starting page from the source address (at two different read voltages) and stores the read starting page to the destination address (either after receiving corrected page data from external error correction if corruption is detected in the read page or immediately without memory controller involvement if corruption is not detected in the read page). The control circuitry 650 increment the current page count and determines whether the current page count matches the ending page number. If the current page does not match the ending page number (meaning that additional pages remain to copy back), the control circuitry 650 increments the source address and the destination address. The control circuitry 650 repeats the process of reading the current page from the source address (as incremented) and checking for corruption before storing the read page to the destination address (as incremented). This process is repeated until the current page count matches the ending page indicated in the instruction to perform the copy-back operation.

To read the current page at two different Vt voltages, the control circuitry 650 can retrieve, from read voltage selection device 630, a current Vt (or default Vt) of the associated memory array 502. The control circuitry 650 can use this value as the first read voltage. The control circuitry 650 can output a signal 529 to regulator 528 (FIG. 5) indicating the first read voltage value. After the page is read, the control circuitry 650 receives the read page data 537 from page buffer 522. The control circuitry 650 stores the received page data 537 (read at the first voltage level) in the copy-back storage device 632 (e.g., in a secondary data cache). The copy-back storage device 632 can include any suitable volatile or non-volatile storage circuitry, such as registers, a NAND storage device, an SSD storage device, or RAM.

After the current page is read at the first read voltage, the control circuitry 650 can retrieve, from the read voltage selection device 630, a second read voltage level for performing second reads of the same memory location during copy-back operations. The second read voltage level can be any value relative to the first read voltage level that is greater than or less than the first read voltage level by a specified amount or percentage of the first read voltage. The first and second read voltages cannot exceed the range of allowable read voltages of the memory array 502. The control circuitry 650 can use this value as the second read voltage. The control circuitry 650 can output a signal 529 to the regulator 528 indicating the second read voltage value. After the page is read again at the second read voltage level, the control circuitry 650 receives the read page data 537 from page buffer 522. The control circuitry 650 stores the received page data 537 (read at the second voltage level) in the copy-back storage device 632 (e.g., in a primary data cache).

The control circuitry 650 instructs a read difference detection device 640 to obtain the data read at the two voltages from copy-back storage device 632 and to determine whether any differences exist. The read difference detection device 640 includes any hardware or software component that is configured to compare two values to detect a difference. For example, the read difference detection device 640 can include a comparator circuit that computes a bit-wise difference between two input values and outputs the bit-wise difference amount. In such cases, the read corruption detection device 642 receives the bit-wise difference amount and determines whether such amount exceeds an allowable corruption threshold. In some other implementations, the read difference detection device 640 can include an XOR circuit (or logic that implements an XOR function). In such circumstances, the read difference detection device 640 determines which bits between the pages read at the two values differ, if any. The read corruption detection device 642 receives the output of the read difference detection device 640 (e.g., the result of the XOR function of the two page data sets) and performs a Cfbyte operation to count the number of non-zero bits. In particular, the XOR function outputs a non-zero bit (e.g., '1') if the bit locations of the page data sets differ and outputs a zero bit (e.g., '0') if the bit locations of the page data sets are the same.

The read corruption detection device 642 can include a comparator circuit or circuitry suitable for performing a compare operation. The read corruption detection device 642 retrieves, from the copy-back storage device 632, an allowable corruption threshold. The read corruption detection device 642 compares the number of non-zero bits found by the read difference detection device 640 to the allowable corruption threshold. In response to determining that the number of non-zero bits exceeds the corruption threshold, the read corruption detection device 642 indicates to the control circuitry 650 that the read page data is corrupt. In response to determining that the number of non-zero bits does not exceed the corruption threshold, the read corruption detection device 642 indicates to the control circuitry 650 that the read page data is not corrupt.

In response to receiving the signal from the read corruption detection device 642 indicating that the data is not corrupt, the control circuitry 650 retrieves the page data from the primary or secondary data cache (e.g., from copy-back storage device 632) and outputs the page data via signals 622 for storage in memory array 502 at the destination location. In response to receiving the signal from the read corruption detection device 642 indicating that the data is corrupt, the control circuitry 650 suspends or interrupts the copy-back operation of copy-back module 535 to correct the read data. For example, the control circuitry 650 retrieves the page data from the primary or secondary data cache (e.g., from copy-back storage device 632) and outputs the page data via signals 622 to an external device (e.g., memory controller or host processor) for error handling. Error correction, handled by an external entity such as a memory controller, can take many forms, such as employing hamming codes, triple modular redundancy, Reed-Solomon error correction, or any other suitable error correction process.

The control circuitry 650 resumes the copy-back operation of the copy-back module 535 in response to receiving the corrected data. For example, the control circuitry 650 outputs the received corrected page data via signals 622 for storage in memory array 502 at the destination location.

Figure 7:
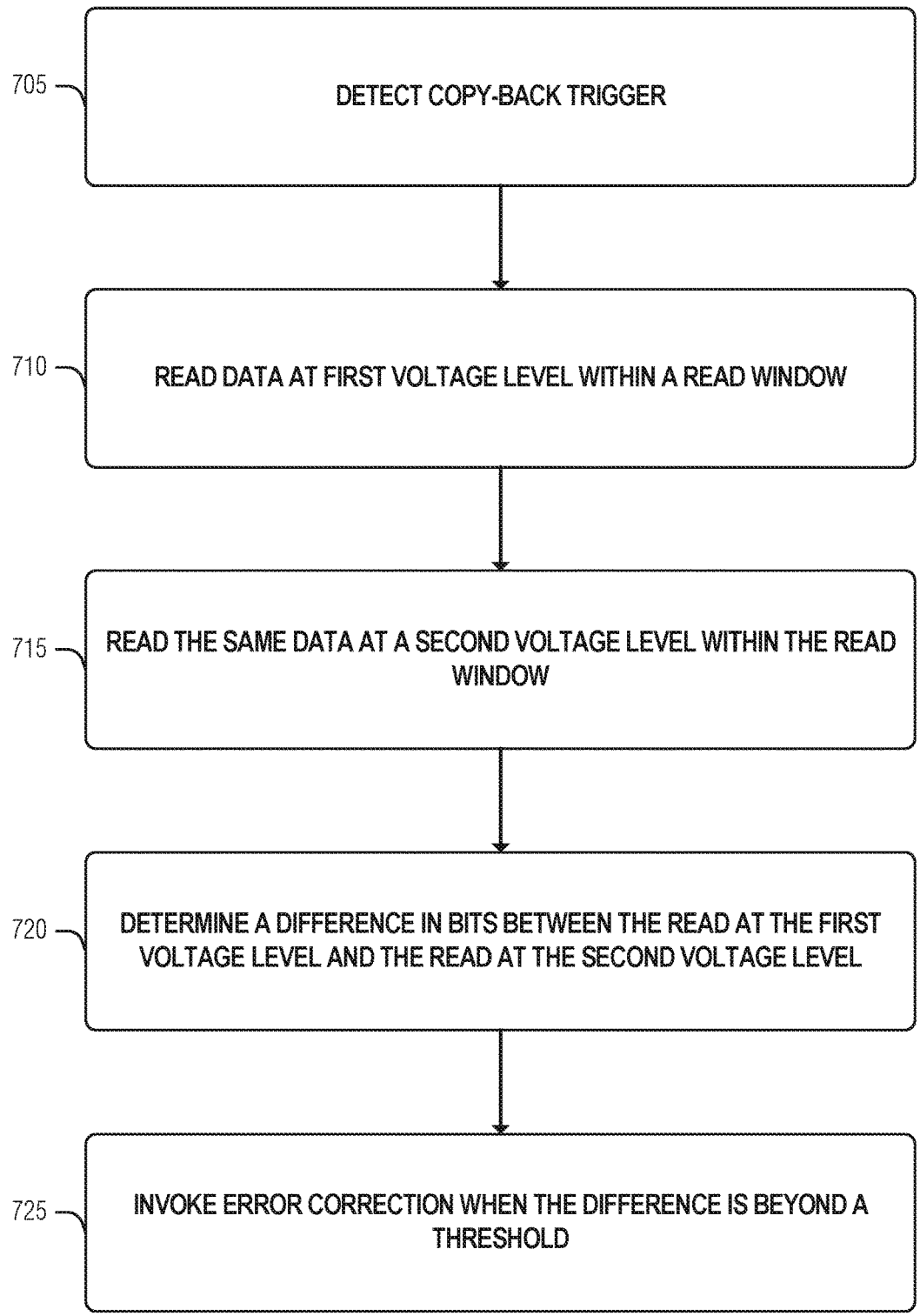
FIG. 7 is a flow chart of a process for performing copy-back operations upon which one or more embodiments can be implemented.

FIG. 7 is a flow chart of a method 700 for performing copy-back operations upon which one or more embodiments can be implemented. The operations of the method 700 are implemented in hardware of a memory device, such as that described above (e.g., a copy-back module, memory control unit, etc.) or below (e.g., processing circuitry), and not within a memory controller or otherwise within a host device.

At operation 705, a trigger to perform a copy-back operation in relation to a section of data stored on the memory device is detected. In an example, the copy-back operation includes the memory device reading a set of data from a first location on the memory device and storing the set of data to a second location on the memory device. In an example, the location has a resolution that is at least one of a page, a block, or a superblock.

At operation 710, the section of data is read from the memory device at a first voltage level within a read window to obtain a first set of bits. In an example, the section of data comprises a page of data. Here, reading the section of data at the first voltage level involves applying the first voltage level to a word line associated with the page of data and storing the first set of bits corresponding to the word line in a first temporary storage device.

At operation 715, the same section of data is read from the memory device at a second voltage level in the read window to obtain a second set of bits. In an example, wherein the section of data is a page, reading the page of data at the second voltage level includes applying the second voltage level to the word line associated with the page of data and storing the second set of bits corresponding to the word line in a second temporary storage device.

At operation a difference between the first and second sets of bits is determined to be beyond a threshold. In an example, determining the difference includes performing a logical XOR operation on the first and second sets of bits. In an example, determining the difference includes counting a number of non-zero bits resulting from the logical XOR operation and comparing the number to the threshold.

At operation 720, error correction is invoked on the section of data in response to the difference between the first and second sets of bits being beyond the threshold. Here, the error correction is invoked prior to completion of the copy-back operation. In an example, invoking the error correction includes interrupting the copy-back operation to transmit the section of data to a memory controller of the memory device. In an example, the method 700 can be extended to include receiving a corrected section of data corresponding to section of data from the memory controller, storing the corrected section of data, and resuming the copy-back operation.

In an example, the method 700 can be extended to include the following operations:

a second instruction to perform a second copy-back operation in relation to a second section of data stored on the memory device can be obtained (e.g., detected, received, retrieved, etc.). The second section of data from the memory device can be read at the first voltage level and the second voltage within the read window to obtain a third set of bits and a fourth set of bits.

A difference between the third and fourth sets of bits is can be determined to be within (e.g., not beyond) a threshold and, in response, the second copy-back operation can be completed without waiting for a memory controller of the memory device.

Figure 8:
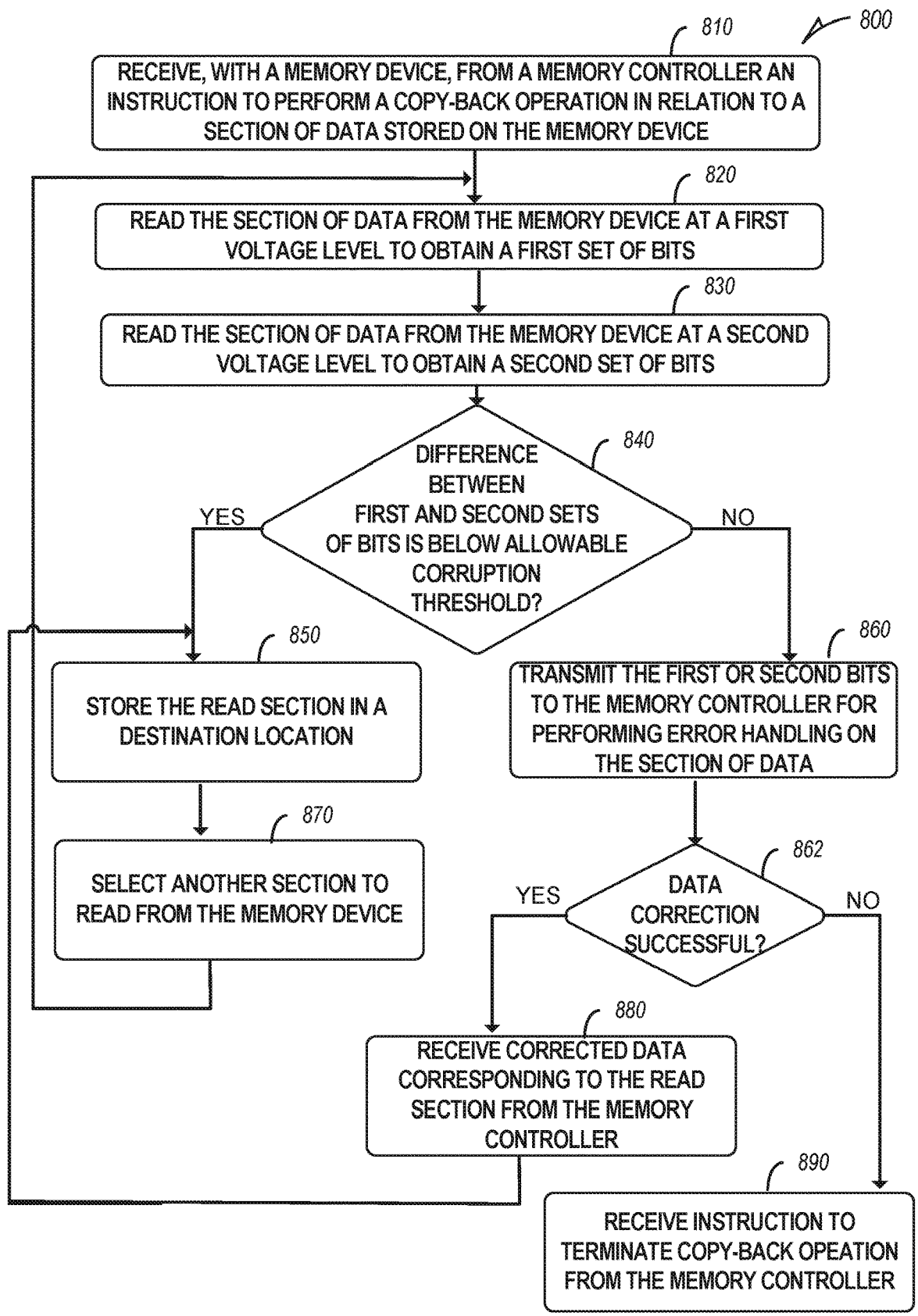
FIG. 8 is a flow chart of a process for performing copy-back operations upon which one or more embodiments can be implemented.

FIG. 8 is a flow chart of an example process 800 for performing copy-back operations upon which one or more embodiments can be implemented. At operation 810, an instruction to perform a copy-back operation in relation to a section of data stored on the memory device is received with a memory device from a memory controller. For example, the copy-back module 535 (e.g., the control circuitry 650) can receive a request to perform a copy-back operation for a set of pages stored in one or more blocks of a memory device in the memory array 120. The request can include a source address, destination address, starting page and ending page.

At operation 820, the section of data is read from the memory device at a first voltage level to obtain a first set of bits. For example, the copy-back module 535 (e.g., the control circuitry 650) can instruct the regulator 528 to apply a first read voltage to the array 502 to read the page of data from a source address at the first voltage level. The read page is stored in page buffer 522 and provided as page data 537 to the copy-back module 535.

At operation 830, the section of data is read from the memory device at a second voltage level to obtain a second set of bits. For example, the copy-back module 535 (e.g., the control circuitry 650) can instruct the regulator 528 to apply a second read voltage to the array 502 (greater than or less than the first read voltage by a specified amount within the Vt of array 502) to read the page of data from the same source address at the second voltage level. The read page is stored in page buffer 522 and provided as page data 537 to the copy-back module 535.

At operation 840, a determination is made as to whether a difference between the first and second sets of bits exceeds a threshold. In response to determining that the difference exceeds the threshold, the process 800 proceeds to operation 850; otherwise the process 800 proceeds to operation 860. For example, the copy-back module 535 (e.g., the read difference detection device 640) can perform a bit-wise comparison or logical XOR operation on the first and second pages read at the two different voltages. The copy-back module 535 (e.g., the read corruption detection device 642) can determine whether any bits between the two read pages differ and if the number of such bits that differ exceeds a corruption threshold. Based on whether the number exceeds the corruption threshold, the copy-back module 535 (e.g., the control circuitry 650) suspends the copy-back operation and proceeds to operation 860 to instruct an external component (e.g., memory controller 115 or circuitry of the host device 105) to correct the data or stores the read data to a destination location in operation 850.

At operation 850, the read section is stored in a destination location. For example, the copy-back module 535 (e.g., the control circuitry 650) stores the read section to a destination location of the memory device.

At operation 860, the first set of bits or the second set of bits is transmitted to the memory controller (e.g., memory controller 115) for performing error handling on the section of data. For example, the copy-back module 535 (e.g., the control circuitry 650) transmits the data stored in the copy-back storage device 632 to the memory controller 115 for performing error correction. In other examples, a signal, such as an interrupt, command status register, etc., can be used to make an error correction entity, such as the memory controller 115, aware of the need for error correction. This signal is another form of invoking the error correction.

At operation 870, another section to read from the memory device is selected. For example, the copy-back module 535 (e.g., the control circuitry 650) can increment a page count and destination location to read a next page from memory device. The subsequent page is read at two different voltages to detect an error (e.g., by performing operations 820, 830, 840, etc.).

At operation 862, a determination is made as to whether data correction was successful. For example, the control unit 530 can determine whether the error correction technique (e.g., hamming codes, triple modular redundancy, Reed-Solomon error correction, read-retries, or any other suitable error correction process) applied to the page of data read from the memory device is correctable. In response to determining that the page of data is correctable, the data is corrected, and the process proceeds to operation 880, otherwise the process proceeds to operation 890.

At operation 880, corrected data corresponding to the read section is received. For example, the copy-back module 535 (e.g., the control circuitry 650) can receive the corrected data, store the corrected data to the read data destination location in operation 850, and resume the copy-back operation.

At operation 890, an instruction to terminate the copy-back operation is received from the memory controller. For example, the copy-back module 535 (e.g., the control circuitry 650) can receive a signal from the memory controller 115 to terminate the copy-back operation.

Process 800 can be performed by any control circuitry or can be performed by dedicated circuitry. Any step in process 800 can be performed out of the sequence represented in FIG. 8 or can be entirely omitted.

Figure 9:
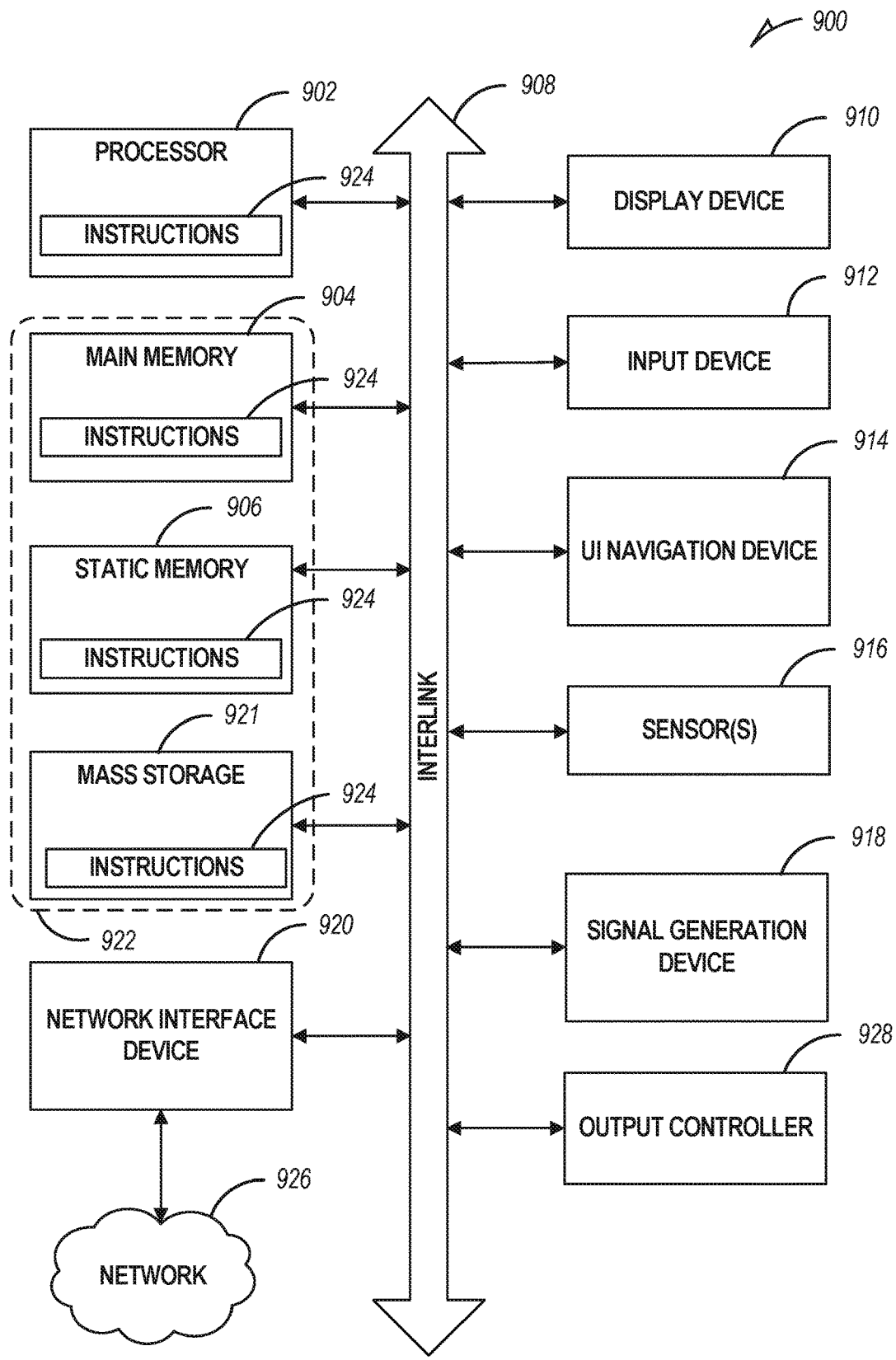
FIG. 9 is a block diagram illustrating an example of a machine upon which one or more embodiments can be implemented.

FIG. 9 illustrates a block diagram of an example machine 900 upon which any one or more of the techniques (e.g., methodologies) discussed herein can perform. In alternative embodiments, the machine 900 can operate as a standalone device or can be connected (e.g., networked) to other machines. In a networked deployment, the machine 900 can operate in the capacity of a server machine, a client machine, or both in server-client network environments. In an example, the machine 900 can act as a peer machine in peer-to-peer (P2P) (or other distributed) network environment. The machine 900 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 900 (e.g., the host device 105, the managed memory device 110, etc.) can include a hardware processor 902 (e.g., a central processing unit (CPU), a graphics processing unit (GPU), a hardware processor core, or any combination thereof, such as the memory controller 115, etc.), a main memory 904 and a static memory 906, some or all of which can communicate with each other via an interlink (e.g., bus) 908. The machine 900 can further include a display unit 910, an alphanumeric input device 912 (e.g., a keyboard), and a user interface (UI) navigation device 914 (e.g., a mouse). In an example, the display unit 910, input device 912 and UI navigation device 914 can be a touch screen display. The machine 900 can additionally include a storage device (e.g., drive unit), a signal generation device 918 (e.g., a speaker), a network interface device 920, one or more sensors 916, such as a global positioning system (GPS) sensor, compass, accelerometer, or other sensor. The machine 900 can include an output controller 928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

A machine-readable medium 922 can include a storage device 921 on which is stored one or more sets of data structures or instructions 924 (e.g., software) embodying or utilized by any one or more of the techniques or functions described herein. The instructions 924 can also reside, completely or at least partially, within the main memory 904, within static memory 906, or within the hardware processor 902 during execution thereof by the machine 900. In an example, one or any combination of the hardware processor 902, the main memory 904, the static memory 906, or the storage device 921 can constitute the machine-readable medium 922.

While the machine readable medium 922 is illustrated as a single medium, the term "machine readable medium" can include a single medium or multiple media (e.g., a centralized or distributed database, or associated caches and servers) configured to store the one or more instructions 924.

The term "machine readable medium" can include any transitory or non-transitory medium that is capable of storing, encoding, or carrying transitory or non-transitory instructions for execution by the machine 900 and that cause the machine 900 to perform any one or more of the techniques of the present disclosure, or that is capable of storing, encoding or carrying data structures used by or associated with such instructions. Non-limiting machine-readable medium examples can include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 924 (e.g., software, programs, an operating system (OS), etc.) or other data are stored on the storage device 921, can be accessed by the memory 904 for use by the processor 902. The memory 904 (e.g., DRAM) is typically fast, but volatile, and is thus a different type of storage than the storage device 921 (e.g., an SSD), which is suitable for long-term storage, including while in an "off" condition. The instructions 924 or data in use by a user or the machine 900 are typically loaded in the memory 904 for use by the processor 902. When the memory 904 is full, virtual space from the storage device 921 can be allocated to supplement the memory 904; however, because the storage device 921 is typically slower than the memory 904, and write speeds are typically at least twice as slow as read speeds, use of virtual memory can greatly reduce user experience due to storage device latency (in contrast to the memory 904, e.g., DRAM). Further, use of the storage device 921 for virtual memory can greatly reduce the usable lifespan of the storage device 921.

In contrast to virtual memory, virtual memory compression (e.g., the Linux® kernel feature "ZRAM") uses part of the memory as compressed block storage to avoid paging to the storage device 921. Paging takes place in the compressed block until it is necessary to write such data to the storage device 921. Virtual memory compression increases the usable size of memory 904, while reducing wear on the storage device 921.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing network speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 924 can further be transmitted or received over a communications network 926 using a transmission medium via the network interface device 920 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 920 can include one or more physical jacks (e.g., Ethernet, coaxial, or phone jacks) or one or more antennas to connect to the communications network 926. In an example, the network interface device 920 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 900, and includes digital or analog communications signals or other intangible medium to facilitate communication of such software.

The above detailed description includes references to the accompanying drawings, which form a part of the detailed description. The drawings show, by way of illustration, specific embodiments in which the inventive subject matter can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, control circuitry, a digital signal processor (DSP), or any other type of processor or processing circuit, including a group of processors or multi-core devices.

It will be understood that when an element is referred to as being "on," "connected to" or "coupled with" another element, it can be directly on, connected, or coupled with the other element, or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

It will be understood that the term "module" (e.g., copyback module) can refer to any combination of software and circuitry to perform or configured to perform the described function. "Module" can refer to a programmable device, non-programmable device. ASIC, PLD, FGPA, or other dedicated or specific circuitry or hardware element configured to perform the described function. "Module" can refer to software (e.g., computer-readable instruction(s), code or a program running on a computer or processor or control circuitry) configured to perform the described function.

Method examples described herein can be machine or computer-implemented at least in part. Some examples can include a transitory or non-transitory computer-readable medium or machine-readable medium encoded with transitory or non-transitory instructions operable to configure an electronic device to perform methods as described in the above examples. An implementation of such methods can include code, such as microcode, assembly language code, a higher-level language code, or the like. Such code can include computer-readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Additional examples of the devices and techniques described above follow:

An example (e.g., "Example 1") of subject matter (e.g., a method or system) can include a method for performing copy-back operations. The method can include receiving, with a memory device from a memory controller, an instruction to perform a copy-back operation in relation to a section of data stored on the memory device; reading the section of data from the memory device at a first voltage level to obtain a first set of bits; reading the section of data from the memory device at a second voltage level to obtain a second set of bits; determining a difference between the first and second sets of bits; and, processing at least one of the first set of bits and the second set of bits based on the difference.

In Example 2, the subject matter of Example 1 can optionally be configured such that the copy-back operation comprises reading a set of data from a given block and storing the set of data to the given block, and wherein processing the at least one of the first and second sets of bits comprises transmitting the first set of bits or the second set of bits to the memory controller for performing error handling on the section of data in response to determining that the difference exceeds a threshold.

In Example 3, the subject matter of any of Examples 1-2 can optionally be configured such that the section of data comprises a page of data, and wherein reading the section of data at the first voltage level comprises: applying the first voltage level to a word line associated with the page of data; and storing the first set of bits corresponding to the word line in a first temporary storage device.

In Example 4, the subject matter of Example 3 can optionally be configured such that reading the page of data at the second voltage level comprises: applying the second voltage level to the word line associated with the page of data; and storing the second set of bits corresponding to the word line in a second temporary storage device.

In Example 5, the subject matter any of Examples 1-4 can optionally be configured such that determining the difference comprises performing a logical XOR operation on the first and second sets of bits.

In Example 6, the subject matter of Example 5 can optionally be configured for counting a number of non-zero bits resulting from the logical XOR operation; and comparing the number to the threshold.

In Example 7, the subject matter of any of Examples 1-6 can optionally be configured for receiving, from the memory controller, corrected data corresponding to the section of data and storing the corrected data to a destination storage location.

In Example 8, the subject matter of any of Examples 1-7 can optionally be configured such that the section is a first page of data, and wherein the processing the at least one of the first set of bits and the second set of bits based on the difference comprises: comparing the difference to a threshold to check the first page of data for errors; determining that the difference is less than the threshold; and in response to determining that the difference is less than the threshold: storing the first set of bits to a destination storage location of the first page of data; selecting a second page of data to be checked for errors; and determining whether a difference between bits of the second page of data read at the first and second voltage levels from the memory device corresponds to an error.

In Example 9, the subject matter of Example 8 can optionally be configured for in response to determining that the difference between bits of the second page of data read at the first and second voltage levels is equal to or greater than the threshold, interrupting the copy-back operation to transmit the bits of the second page of data read at the first voltage level or the second voltage level to the memory controller.

In Example 10, the subject matter of Example 9 can optionally be configured for receiving, with the memory device, a corrected page corresponding to the second page of data from the memory controller; storing the corrected page to another destination storage location of the second page of data; and resuming the copy-back operation.

An Example 11 of subject matter (e.g., a method or system) can include a memory system for performing copy-back operations. The memory system can include control circuitry configured to receive, with a memory device from a memory controller, an instruction to perform a copy-back operation in relation to a section of data stored on the memory device; read the section of data from the memory device at a first voltage level to obtain a first set of bits; read the section of data from the memory device at a second voltage level to obtain a second set of bits; determine a difference between the first and second sets of bits; and process at least one of the first set of bits and the second set of bits based on the difference.

In Example 12, the subject matter of Example 11 can optionally be configured such that the copy-back operation comprises reading a set of data from a given block and storing the set of data to the given block, and wherein the control circuitry is configured to process the at least one of the first and second sets of bits by transmitting the first set of bits or the second set of bits to the memory controller for performing error handling on the section of data in response to determining that the difference exceeds a threshold.

In Example 13, the subject matter of any of Examples 11-12 can optionally be configured such that the section of data comprises a page of data, and wherein the control circuitry is configured to read the section of data at the first voltage level by: applying the first voltage level to a word line associated with the page of data; and storing the first set of bits corresponding to the word line in a first temporary storage device.

In Example 14, the subject matter of Example 13 can optionally be configured such that the control circuitry is configured to read the page of data at the second voltage level by: applying the second voltage level to the word line associated with the page of data; and storing the second set of bits corresponding to the word line in a second temporary storage device.

In Example 15, the subject matter of any of Examples 11-14 can optionally be configured such that the control circuitry is configured to determine the difference by performing a logical XOR operation on the first and second sets of bits.

In Example 16, the subject matter of Example 15 can optionally be configured such that the control circuitry is further configured to: count a number of non-zero bits resulting from the logical XOR operation; and compare the number to the threshold.

In Example 17, the subject matter of any of Examples 11-16 can optionally be configured such that the control circuitry is further configured to receive, from the memory controller, corrected data corresponding to the section of data and storing the corrected data to a destination storage location.

In Example 18, the subject matter of any of Examples 11-17 can optionally be configured such that the section is a first page of data, and wherein the control circuitry is configured to process the at least one of the first set of bits and the second set of bits based on the difference by: comparing the difference to a threshold to check the first page of data for errors; determining that the difference is less than the threshold; and in response to determining that the difference is less than the threshold: storing the first set of bits to a destination storage location of the first page of data; selecting a second page of data to be checked for errors; and determining whether a difference between bits of the second page of data read at the first and second voltage levels from the memory device corresponds to an error.

In Example 19, the subject matter of Example 18 can optionally be configured such that the control circuitry is further configured to in response to determining that the difference between bits of the second page of data read at the first and second voltage levels is equal to or greater than the threshold, interrupt the copy-back operation to transmit the bits of the second page of data read at the first voltage level or the second voltage level to the memory controller.

In Example 20, the subject matter of Example 19 can optionally be configured such that the control circuitry is further configured to receive a corrected page corresponding to the second page of data from the memory controller; store the corrected page to another destination storage location of the second page of data; and resume the copy-back operation.

Example 21 is a memory device comprising: an interface to a controller of the memory device; and control circuitry to: detect trigger to perform a copy-back operation in relation to a section of data stored on the memory device; read the section of data from the memory device at a first voltage level within a read window to obtain a first set of bits; read the section of data from the memory device at a second voltage level in the read window to obtain a second set of bits; determine that a difference between the first and second sets of bits is beyond a threshold; and invoke, via the interface, error correction on the section of data in response to the difference between the first and second sets of bits being beyond the threshold, the error correction invoked prior to completion of the copy-back operation.

In Example 22, the subject matter of Example 21, wherein, to perform the copy-back operation, the control circuitry is to: read a set of data from a first location on the memory device; and store the set of data to a second location on the memory device.

In Example 23, the subject matter of Example 22, wherein the location has a resolution that is at least one of a page, a block, or a superblock.

In Example 24, the subject matter of any of Examples 21-23, wherein the section of data comprises a page of data, and wherein, to read the section of data at the first voltage level, the control circuitry is to: apply the first voltage level to a word line associated with the page of data; and store the first set of bits corresponding to the word line in a first temporary storage device.

In Example 25, the subject matter of Example 24, wherein, to read the page of data at the second voltage level, the control circuitry is to: apply the second voltage level to the word line associated with the page of data; and store the second set of bits corresponding to the word line in a second temporary storage device.

In Example 26, the subject matter of any of Examples 21-25, wherein, to determine the difference, the control circuitry is to perform a logical XOR operation on the first and second sets of bits.

In Example 27, the subject matter of Example 26 wherein, to determine the difference, the control circuitry is to: count a number of non-zero bits resulting from the logical XOR operation; and compare the number to the threshold.

In Example 28, the subject matter of any of Examples 21-27, wherein, to invoke the error correction, the control circuitry is to interrupt the copy-back operation to transmit the section of data via to the controller of the memory device via the interface.

In Example 29, the subject matter of Example 28, wherein the control circuitry is to: receive a corrected section of data corresponding to section of data from the controller; store the corrected section of data; and resume the copy-back operation.

In Example 30, the subject matter of any of Examples 28-29, wherein the controller is included in a managed memory package that also includes the memory device.

In Example 31, the subject matter of any of Examples 28-30, wherein the controller is external to a package that includes the memory device.

In Example 32, the subject matter of any of Examples 21-31, wherein the control circuitry is to: receive a second instruction to perform a second copy-back operation in relation to a second section of data stored on the memory device; read the second section of data from the memory device at the first voltage level within the read window to obtain a third set of bits; read the second section of data from the memory device at the second voltage level in the read window to obtain a fourth set of bits; determine that a difference between the third and fourth sets of bits is not beyond a threshold; and complete the second copy-back operation without waiting for a memory controller of the memory device.

Example 33 is a method comprising: detecting, at a memory device, a trigger to perform a copy-back operation in relation to a section of data stored on the memory device; reading, by the memory device, the section of data from the memory device at a first voltage level within a read window to obtain a first set of bits; reading, by the memory device, the section of data from the memory device at a second voltage level in the read window to obtain a second set of bits; determining, by the memory device, that a difference between the first and second sets of bits is beyond a threshold; and invoking, by the memory device, error correction on the section of data in response to the difference between the first and second sets of bits being beyond the threshold, the error correction invoked prior to completion of the copy-back operation.

In Example 34, the subject matter of Example 33, wherein the copy-back operation comprises the memory device reading a set of data from a first location on the memory device and storing the set of data to a second location on the memory device.

In Example 35, the subject matter of Example 34, wherein the location has a resolution that is at least one of a page, a block, or a superblock.

In Example 36, the subject matter of any of Examples 33-35, wherein the section of data comprises a page of data, and wherein reading the section of data at the first voltage level comprises: applying the first voltage level to a word line associated with the page of data; and storing the first set of bits corresponding to the word line in a first temporary storage device.

In Example 37, the subject matter of Example 36, wherein reading the page of data at the second voltage level comprises: applying the second voltage level to the word line associated with the page of data; and storing the second set of bits corresponding to the word line in a second temporary storage device.

In Example 38, the subject matter of any of Examples 33-37, wherein determining the difference comprises performing a logical XOR operation on the first and second sets of bits.

In Example 39, the subject matter of Example 38, wherein determining the difference comprises: counting a number of non-zero bits resulting from the logical XOR operation; and comparing the number to the threshold.

In Example 40, the subject matter of any of Examples 33-39, wherein invoking the error correction comprises interrupting the copy-back operation to transmit the section of data to a memory controller of the memory device.

In Example 41, the subject matter of Example 40, comprising: receiving, with the memory device, a corrected section of data corresponding to section of data from the memory controller; storing the corrected section of data; and resuming the copy-back operation.

In Example 42, the subject matter of any of Examples 40-41, wherein the memory controller is included in a managed memory package that also includes the memory device.

In Example 43, the subject matter of any of Examples 40-42, wherein the memory controller is external to a package that includes the memory device.

In Example 44, the subject matter of any of Examples 33-43, comprising: receiving, at the memory device, a second instruction to perform a second copy-back operation in relation to a second section of data stored on the memory device; reading the second section of data from the memory device at the first voltage level within the read window to obtain a third set of bits; reading the second section of data from the memory device at the second voltage level in the read window to obtain a fourth set of bits; determining that a difference between the third and fourth sets of bits is not beyond a threshold; and completing the second copy-back operation without waiting for a memory controller of the memory device.

Example 45 is a system comprising: means for detecting, at a memory device, a trigger to perform a copy-back operation in relation to a section of data stored on the memory device; means for reading, by the memory device, the section of data from the memory device at a first voltage level within a read window to obtain a first set of bits; means for reading, by the memory device, the section of data from the memory device at a second voltage level in the read window to obtain a second set of bits; means for determining, by the memory device, that a difference between the first and second sets of bits is beyond a threshold; and means for invoking, by the memory device, error correction on the section of data in response to the difference between the first and second sets of bits being beyond the threshold, the error correction invoked prior to completion of the copy-back operation.

In Example 46, the subject matter of Example 45, wherein the copy-back operation comprises the memory device reading a set of data from a first location on the memory device and storing the set of data to a second location on the memory device.

In Example 47, the subject matter of Example 46, wherein the location has a resolution that is at least one of a page, a block, or a superblock.

In Example 48, the subject matter of any of Examples 45-47, wherein the section of data comprises a page of data, and wherein the means for reading the section of data at the first voltage level comprise: means for applying the first voltage level to a word line associated with the page of data; and means for storing the first set of bits corresponding to the word line in a first temporary storage device.

In Example 49, the subject matter of Example 48, wherein the means for reading the page of data at the second voltage level comprise: means for applying the second voltage level to the word line associated with the page of data; and means for storing the second set of bits corresponding to the word line in a second temporary storage device.

In Example 50, the subject matter of any of Examples 45-49, wherein the means for determining the difference comprise means for performing a logical XOR operation on the first and second sets of bits.

In Example 51, the subject matter of Example 50 wherein the means for determining the difference comprise: means for counting a number of non-zero bits resulting from the logical XOR operation; and means for comparing the number to the threshold.

In Example 52, the subject matter of any of Examples 45-51, wherein the means for invoking the error correction comprise means for interrupting the copy-back operation to transmit the section of data to a memory controller of the memory device.

In Example 53, the subject matter of Example 52, comprising: means for receiving, with the memory device, a corrected section of data corresponding to section of data from the memory controller; means for storing the corrected section of data; and means for resuming the copy-back operation.

In Example 54, the subject matter of any of Examples 52-53, wherein the memory controller is included in a managed memory package that also includes the memory device.

In Example 55, the subject matter of any of Examples 52-54, wherein the memory controller is external to a package that includes the memory device.

In Example 56, the subject matter of any of Examples 45-55, comprising: means for receiving, at the memory device, a second instruction to perform a second copy-back operation in relation to a second section of data stored on the memory device; means for reading the second section of data from the memory device at the first voltage level within the read window to obtain a third set of bits; means for reading the second section of data from the memory device at the second voltage level in the read window to obtain a fourth set of bits; means for determining that a difference between the third and fourth sets of bits is not beyond a threshold; and means for completing the second copy-back operation without waiting for a memory controller of the memory device.

Example 57 is a non-transitory machine readable medium including instructions that, when executed by processing circuitry of a memory device, cause the memory device to perform operations comprising: detecting a trigger to perform a copy-back operation in relation to a section of data stored on the memory device; reading the section of data from the memory device at a first voltage level within a read window to obtain a first set of bits; reading the section of data from the memory device at a second voltage level in the read window to obtain a second set of bits; determining that a difference between the first and second sets of bits is beyond a threshold; and invoking error correction on the section of data in response to the difference between the first and second sets of bits being beyond the threshold, the error correction invoked prior to completion of the copy-back operation.

In Example 58, the subject matter of Example 57, wherein the copy-back operation comprises: reading a set of data from a first location on the memory device; and storing the set of data to a second location on the memory device.

In Example 59, the subject matter of Example 58, wherein the location has a resolution that is at least one of a page, a block, or a superblock.

In Example 60, the subject matter of any of Examples 57-59, wherein the section of data comprises a page of data, and wherein reading the section of data at the first voltage level comprises: applying the first voltage level to a word line associated with the page of data; and storing the first set of bits corresponding to the word line in a first temporary storage device.

In Example 61, the subject matter of Example 60, wherein reading the page of data at the second voltage level comprises: applying the second voltage level to the word line associated with the page of data; and storing the second set of bits corresponding to the word line in a second temporary storage device.

In Example 62, the subject matter of any of Examples 57-61, wherein determining the difference comprises performing a logical XOR operation on the first and second sets of bits.

In Example 63, the subject matter of Example 62 wherein determining the difference comprises: counting a number of non-zero bits resulting from the logical XOR operation; and comparing the number to the threshold.

In Example 64, the subject matter of any of Examples 57-63, wherein invoking the error correction comprises interrupting the copy-back operation to transmit the section of data to a memory controller of the memory device.

In Example 65, the subject matter of Example 64, wherein the instructions comprise: receiving, with the memory device, a corrected section of data corresponding to section of data from the memory controller; storing the corrected section of data; and resuming the copy-back operation.

In Example 66, the subject matter of any of Examples 64-65, wherein the memory controller is included in a managed memory package that also includes the memory device.

In Example 67, the subject matter of any of Examples 64-66, wherein the memory controller is external to a package that includes the memory device.

In Example 68, the subject matter of any of Examples 57-67, wherein the instructions comprise: receiving a second instruction to perform a second copy-back operation in relation to a second section of data stored on the memory device; reading the second section of data from the memory device at the first voltage level within the read window to obtain a third set of bits; reading the second section of data from the memory device at the second voltage level in the read window to obtain a fourth set of bits; determining that a difference between the third and fourth sets of bits is not beyond a threshold; and completing the second copy-back operation without waiting for a memory controller of the memory device.

Example 69 is at least one machine-readable medium including instructions that, when executed by processing circuitry, cause the processing circuitry to perform operations to implement of any of Examples 1-68.

Example 70 is an apparatus comprising means to implement of any of Examples 1-68.

Example 71 is a system to implement of any of Examples 1-68.

Example 72 is a method to implement of any of Examples 1-68.

The above description is intended to be illustrative, and not restrictive. The scope of the inventive subject matter should be determined with reference to the appended claims, along with the full scope of equivalents to which such claims are entitled.

The invention claimed is:

1. A memory device comprising:
storage devices; and
control circuitry to:
execute a first read and a second read of a storage location in the storage devices, the first read and the second read differing in read voltage used to perform the first read and the second read, the first read producing first data, the second read producing second data;
compare the first data and the second data to determine whether the first data and the second data differ beyond a threshold; and
start error correction on the storage location when the first data and the second data differ beyond the threshold.

2. The memory device of claim 1, wherein, to perform a copy-back operation, the control circuitry is to:
read a set of data from a first location in the storage devices; and
store the set of data to a second location in the storage devices; and
wherein the first read and the second read are performed on the first location to read the set of data as part of a copyback operation.

3. The memory device of claim 2, wherein the location has a resolution that is at least one of a page, a block, or a superblock.

4. The memory device of claim 1, wherein the first data and the second data are a page of data, and wherein, to execute the first read and the second read at differing read voltages, the control circuitry is to:
apply a first voltage level to a word line associated with the page of data for the first read;
store the first set of bits corresponding to the word line in a first temporary storage device;
apply a second voltage level to the word line associated with the page of data for the second read; and
store the second set of bits corresponding to the word line in a second temporary storage device.

5. The memory device of claim 4, wherein, to compare the first data and the second data to determine whether the first data and the second data differ beyond the threshold, the control circuitry is to perform a logical XOR operation on the first and second sets of bits.

6. The memory device of claim 5 wherein, to compare the first data and the second data to determine whether the first data and the second data differ beyond the threshold, the control circuitry is to:
count a number of non-zero bits resulting om the logical XOR operation; and
compare the number to the threshold.

7. The memory device of claim 1, wherein, to start the error correction, the control circuitry is to interrupt a current operation to transmit the first data or the second data to a controller of the memory device, the controller performing the error correction.

8. A method comprising:
executing, by a memory device a first read and a second read of a storage location in storage devices of the memory device, the first read and the second read differing in read voltage used to perform the first read and the second read, the first read producing first data, the second read producing second data;
comparing the first data and the second data to determine whether the first data and the second data differ beyond a threshold; and
starting error correction on the storage location when the first data and the second data differ beyond the threshold.

9. The method of claim 8, wherein performing a copy-back operation includes:
reading a set of data from a first location in the storage devices; and
storing the set of data to a second location in the storage devices; and
wherein the first read and the second read are performed on the first location to read the set of data as part of a copy-back operation.

10. The method of claim 9, wherein the location has a resolution that is at least one of a page, a block, or a superblock.

11. The method of claim 8, wherein the first data and the second data are a page of data, and wherein executing the first read and the second read at differing read voltages includes:
- applying a first voltage level to a word line associated with the page of data for the first read;
- storing the first set of bits corresponding to the word line in a first temporary storage device;
- applying a second voltage level to the word line associated with the page of data for the second read; and
- storing the second set of bits corresponding to the word line in a second temporary storage device.

12. The method of claim 11, wherein comparing the first data and the second data to determine whether the first data and the second data differ beyond the threshold includes performing a logical XOR operation on the first and second sets of bits.

13. The method of claim 12 wherein comparing the first data and the second data to determine whether the first data and the second data differ beyond the threshold includes:
- counting a number of non-zero bits resulting from the logical XOR operation; and
- comparing the number to the threshold.

14. The method of claim 8, wherein starting the error correction includes interrupting a current operation to transmit the first data or the second data to a controller of the memory device, the controller performing the error correction.

15. A non-transitory machine-readable medium including instructions that, when executed by processing circuitry of a memory device, cause the memory device to perform operations comprising:
- executing, by a memory device a first read and a second read of a storage location in storage devices of the memory device, the first read and the second read differing in read voltage used to perform the first read and the second read, the first read producing first data, the second read producing second data;
- comparing the first data and the second data to determine whether the first data and the second data differ beyond a threshold; and
- starting error correction on the storage location when the first data and the second data differ beyond the threshold.

16. The non-transitory machine-readable medium of claim 15, wherein performing a copy-back operation includes:
- reading a set of data from a first location in the storage devices; and
- storing the set of data to a second location in the storage devices; and
- wherein the first read and the second read are performed on the first location to read the set of data as part of a copy-back operation.

17. The non-transitory machine-readable medium of claim 16, wherein the location has a resolution that is at least one of a page, a block, or a superblock.

18. The non-transitory machine-readable medium of claim 15, wherein the first data and the second data are a page of data, and wherein executing the first read and the second read at differing read voltages includes:
- applying a first voltage level to a word line associated with the page of data for the first read;
- storing the first set of bits corresponding to the word line in a first temporary storage device;
- applying a second voltage level to the word line associated with the page of data for the second read; and
- storing the second set of bits corresponding to the word line in a second temporary storage device.

19. The non-transitory machine-readable medium of claim 18, wherein comparing the first data and the second data to determine whether the first data and the second data differ beyond the threshold includes performing a logical XOR operation on the first and second sets of bits.

20. The non-transitory machine-readable medium of claim 19 wherein comparing the first data and the second data to determine whether the first data and the second data differ beyond the threshold includes:
- counting a number of non-zero bits resulting from the logical XOR operation; and
- comparing the number to the threshold.

21. The non-transitory machine-readable medium of claim 15, wherein starting the error correction includes interrupting a current operation to transmit the first data or the second data to a controller of the memory device, the controller performing the error correction.

* * * * *